United States Patent
Ho et al.

(10) Patent No.: US 6,960,826 B2
(45) Date of Patent: Nov. 1, 2005

(54) MULTI-CHIP PACKAGE AND MANUFACTURING METHOD THEREOF

(75) Inventors: Kwun-Yao Ho, Taipei Hsien (TW); Moriss Kung, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/710,842

(22) Filed: Aug. 6, 2004

(65) Prior Publication Data

US 2005/0029644 A1 Feb. 10, 2005

(51) Int. Cl.⁷ .............................. H01L 23/34
(52) U.S. Cl. ............... 257/723; 257/685; 257/686; 438/109
(58) Field of Search ................... 257/723, 685, 257/686; 438/109

(56) References Cited

U.S. PATENT DOCUMENTS

| | | | | |
|---|---|---|---|---|
| 5,703,400 A | * | 12/1997 | Wojnarowski et al. | 257/723 |
| 5,757,022 A | * | 5/1998 | Kobayashi et al. | 250/583 |
| 5,825,080 A | * | 10/1998 | Imaoka et al. | 257/659 |
| 5,841,193 A | * | 11/1998 | Eichelberger | 257/723 |
| 5,886,401 A | * | 3/1999 | Liu | 257/678 |
| 6,057,593 A | * | 5/2000 | Iovdalsky et al. | 257/659 |
| 6,087,719 A | * | 7/2000 | Tsunashima | 257/686 |
| 6,239,482 B1 | * | 5/2001 | Fillion et al. | 257/678 |
| 6,400,573 B1 | * | 6/2002 | Mowatt et al. | 361/719 |
| 6,650,009 B2 | * | 11/2003 | Her et al. | 257/686 |
| 6,680,529 B2 | * | 1/2004 | Chen et al. | 257/700 |

* cited by examiner

*Primary Examiner*—Jasmine Clark
(74) *Attorney, Agent, or Firm*—Jianq Chyun IP Office

(57) ABSTRACT

A multi-chip package comprising a carrier, at least a package module, an insulation layer and a patterned metallic layer is provided. The package module is mounted onto one of the surfaces of the carrier. The package module has a plurality of stacked chips electrically connected to each other using a flip chip bonding technique. The insulation layer is formed over the surface of the carrier and encloses the package module. The insulation layer has a plurality of via holes linked to the surface of the carrier and the package module. Depth of the via holes in a direction perpendicular to the surface of the carrier is greater than height of the package module in the same direction. The patterned metallic layer is formed over the insulation layer and fills the via holes, serving as interconnecting lines inside the multi-chip package.

21 Claims, 6 Drawing Sheets

MULTI-CHIP PACKAGE AND MANUFACTURING METHOD THEREOF

CROSS REFERENCE TO RELATED APPLICATIONS

This application claims the priority benefit of Taiwan application serial no. 92121788, filed Aug. 8, 2003.

BACKGROUND OF INVENTION

1. Field of the Invention

The present invention relates to a multi-chip package and manufacturing method thereof. More particularly, the present invention relates to a high electrical performance multi-chip package that can be manufactured with fewer processing steps.

2. Description of the Related Art

In this information-centered society, everyone is shopping around for high speed, high quality, and multifunctional products. As far as aesthetic appearance is concerned, most products are designed to be slim, compact, light and easy to use. In order to achieve the above goals, most manufacturers will incorporate system design concepts into their products so that a single chip can have a variety of functions. Ultimately, the total number of chips inside each electrical product and the circuit volume can be reduced. Furthermore, to reduce the size and weight of each chip package, a few packaging methods has been developed. The chip packaging techniques commonly deployed include multi-chip module (MCM), chip-scale package (CSP) and stacked multi-chip package.

FIG. 1 is a schematic cross-sectional view of a conventional multi-chip package. As shown in FIG. 1, the multi-chip package 100 includes three chips 110, 120, 130, a plurality of insulation layers 140, 142, 144, 146, three metallic layers 150, 152, 154 and a plurality of solder balls 160. Each of the chips 110, 120, 130 has a plurality of chip bonding pads 114, 124, 134 located on their respective active surfaces 112, 122 and 132.

To manufacture the multi-chip package 100, the backside 126 of the chip 120 is attached to the active surface 112 of the chip 110 using an adhesive material 170. The insulation layer 140 is formed on the active surface 112 of the chip 110 to enclose the chip 120. Thereafter, the insulation layer 140 is patterned to form a plurality of via holes 141a and 141b that expose the bonding pads 114 and 124. A metallic layer 150 is formed over the insulation layer 140 and fills the via holes 141a and 141b. Photolithographic and etching processes are carried out to pattern the metallic layer 150 and then another insulation layer 142 is formed over the insulation layer 140 and the metallic layer 150.

Afterwards, the backside 136 of the chip 130 is attached to the insulation layer 142 using an adhesive material 172. Another insulation layer 144 is formed over the insulation layer 142 so that the chip 130 is entirely enclosed. The insulation layers 144 and 142 are patterned to form a plurality of via holes 144a and 144b that exposes a portion of the metallic layer 150 and the bonding pads 134. Thereafter, a metallic layer 152 is formed over the insulation layer 144 such that the via holes 144a and 144b are filled with the metallic layer 152. Photolithographic and etching processes are carried out to pattern the metallic layer 152 and then an insulation layer 146 is formed over the insulation layer 144 and the metallic layer 152. The insulation layer 146 is patterned to form a plurality of openings 147 that exposes the metallic layer 152. Another metallic layer 154 is formed over the insulation layer 146 such that the openings 147 are filled with the metallic layer 154. Thereafter, photolithographic and etching processes are again used to pattern the metallic layer 154. Finally, a plurality of solder balls 160 are attached to the metallic layer 154 so that the multi-chip package 100 can connect electrically with an external circuit (not shown) via the solder balls 160.

In the aforementioned multi-chip fabricating process, after stacking the chip 120 on the chip 110, a pair of insulation layers 140, 142 and a metallic layer 150 are formed to electrically connect the chips 110 and 120. Furthermore, after attaching the chip 130 to the insulation layer 142, another pair of insulation layers 144, 146 and a metallic layer 152 are formed to electrically connect the chips 110, 120 and 130. In other words, at least an insulation layer and a metallic layer must be formed whenever an additional chip is attached to the multi-chip package. Moreover, the via holes 141a, 144a that pass through various insulation layers has a depth approximately equal to the thickness of a chip. Hence, the manufacturing process is time-consuming and highly inefficient.

In addition, the chips 110, 120 130 are interconnected through the metallic layers 150 and 152 and hence the average length of electrical pathways connecting the chips 110, 120, 130 are longer. Consequently, the multi-chip package will have a somewhat larger distortion in internal signal transmission.

SUMMARY OF INVENTION

Accordingly, one object of the present invention is to provide a multi-chip package structure and manufacturing method thereof that uses a flip chip electrical connection for shortening inter-chip connection pathways and improving signal transmission quality of the package.

A second object of this invention is to provide a multi-chip package structure and manufacturing method thereof such that an insulation layer and a patterned metallic layer are formed over a carrier only after all the chips have been attached to the carrier. Hence, only a single patterned metallic layer is required to form interconnections inside the multi-chip package and the number of steps for fabricating the package is reduced.

A third object of this invention is to provide a multi-chip package structure and manufacturing method thereof such that chips can be packaged and electrically tested before assembling together into a multi-chip package. Thus, overall yield of the multi-chip package is increased.

To achieve these and other advantages and in accordance with the purpose of the invention, as embodied and broadly described herein, the invention provides a multi-chip package structure. The multi-chip package structure at least comprises a carrier, a stacked multi-chip module, an insulation layer and a patterned metallic layer. The multi-chip module is positioned on a surface of the carrier. The insulation layer is formed over the surface of the carrier to enclose the multi-chip module. The insulation layer has a plurality of via holes linked to the surface of the carrier or the multi-chip module. At least a via hole has a depth greater than the thickness of the multi-chip module. The patterned metallic layer is formed over the insulation layer and fills the via holes. The patterned metallic layer serves as an interconnecting layer inside the multi-chip package.

This invention also provides a method of forming a multi-chip package. First, a multi-chip module with a stack of chips and a carrier are provided. Thereafter, the multi-chip module is attached to a surface of the carrier. An insulation layer is formed over the surface of the carrier so that the multi-chip module is enclosed. Via holes that pass through the insulation layer and link to the surface of the carrier or the multi-chip module are formed. Finally, a patterned metallic layer is formed over the insulation layer and fills the via holes.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
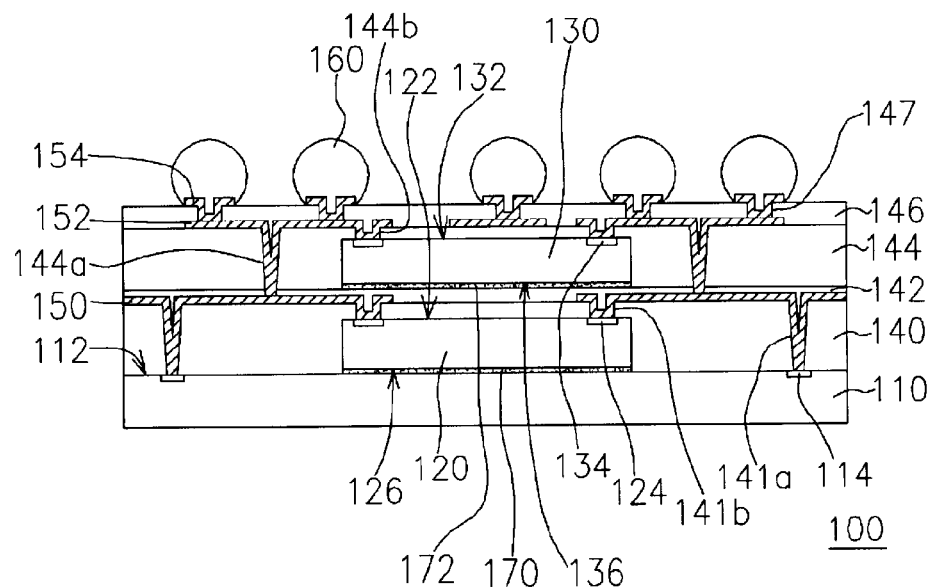
FIG. 1 is a schematic cross-sectional view of a conventional multi-chip package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
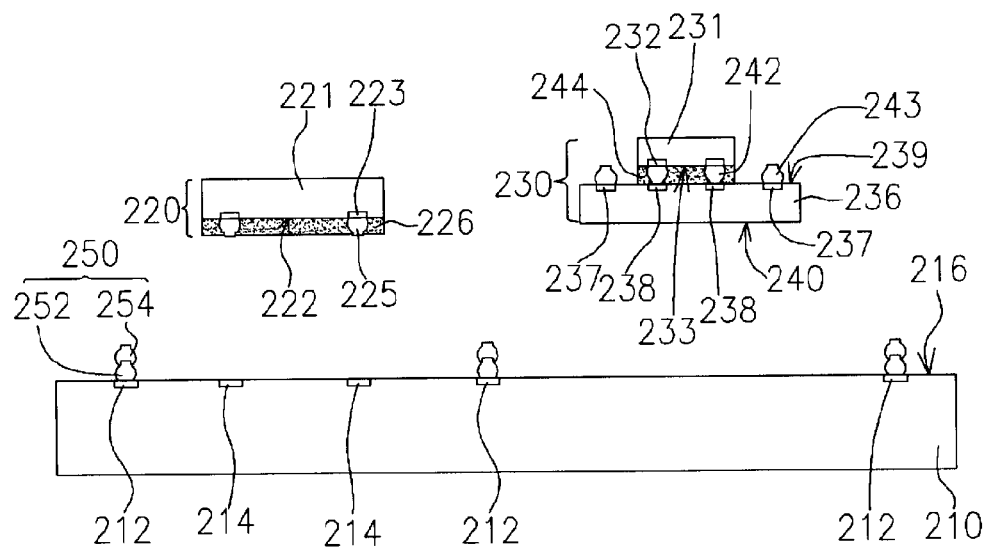
FIGS. 2 to 8 are schematic cross-sectional views showing the progression of steps of fabricating a multi-chip package according to a first preferred embodiment of this invention.

FIGS. 2 to 8 are schematic cross-sectional views showing the progression of steps of fabricating a multi-chip package according to a first preferred embodiment of this invention. As shown in FIG. 2, a carrier 210, a first package module 220 and second package module 230 are provided. The carrier 210 can be a chip (an active device) or an integrated circuit (IC) package substrate (for example, a glass substrate, a ceramic substrate or a polymer substrate), wherein passive devices can be embedded in the substrate. The carrier 210 has a plurality of bonding pads 212, 214 located on a surface 216. A plurality of contacts 250 is formed on the surface of the respective bonding pads 212. Each contact 250 may comprise of a bump or a stack of bumps according to design. In this embodiment, the contact 250 is formed by stacking the bumps 252 and 254 over the bonding pad 212. However, the step for fabricating the contacts 250 can be eliminated altogether in this invention.

The package module 220 is a chip-scaled package (CSP) comprising a chip 221, a plurality of bumps 225 and an insulation layer 226. The chip 221 has a plurality of bonding pads 223 on an active surface 222. The bumps 225 are bonded to the respective bonding pads 223. The insulation layer 226 is set over the active surface 222 of the chip 221 to enclose the bumps 225. Typically, the package module 220 is electrically tested to ensure a good electrical performance before attaching to the carrier 210.

The package module 230 is a stacked chip module. In this embodiment, the package module 230 comprises a first chip 231, a second chip 236, a plurality of bumps 242, a plurality of contacts 243 and an insulation layer 244. The first chip 231 has a plurality of bonding pads 232 on an active surface 233. Similarly, the second chip 236 has a plurality of bonding pads 237, 238 on an active surface 239. The first chip 231 is electrically connected to the bonding pads 238 on the second chip 236 via a plurality of bumps 242 using a flip chip bonding technique. The insulation layer 244 is sandwiched between the active surface 233 of the first chip 231 and the active surface 239 of the second chip 236 so that the bumps 242 are entirely enclosed. Before or after attaching the first chip 231 to the second chip 236, a plurality of contacts 243 may also be formed on the bonding pads 237 of the second chip 236. Furthermore, before attaching the package module 230 to the carrier 210, an electrical test of the package module 230 may be carried out via the contacts 243 to ensure the quality of both chips 231 and 236.

Figure 3:
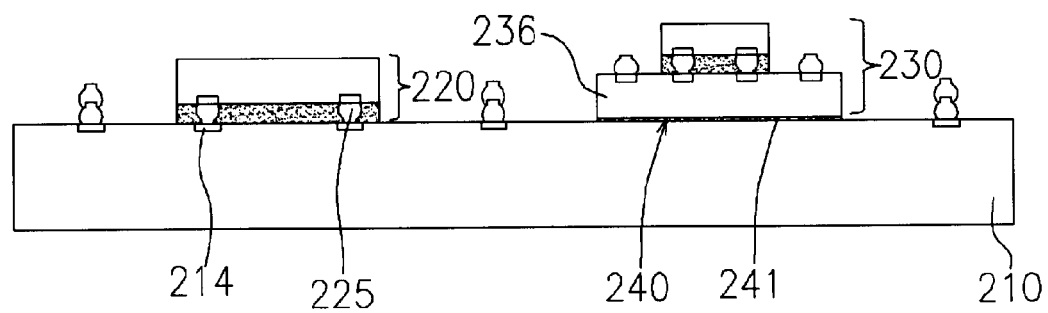

As shown in FIG. 3, the package module 220 is attached to the carrier 210 via the bumps 225 using a flip chip bonding technique. The package module 230 is attached to the carrier 210 through some adhesive material 241 applied to the backside 240 of the second chip 236.

Figure 4:
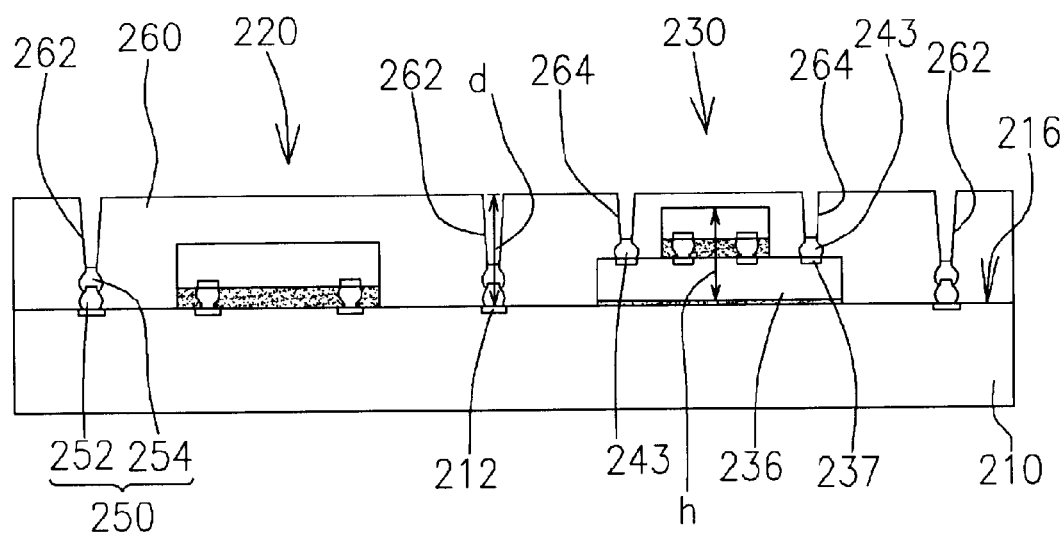

As shown in FIG. 4, an insulation layer 260 is formed over the carrier 210 by spin-coating or processing with a thermal press. The insulation layer 260 encloses the package modules 220 and 230. Thereafter, photolithographic and etching processes, a laser drilling, a mechanical drilling method or a plasma etching process can be used to form a plurality of via holes 262 and 264 in the insulation layer 260. The via holes 262 align with the bonding pads 212 on the carrier 212 so that each via hole 262 is directly linked to a contact 250. Depth d of the via hole 262 in a direction perpendicular to the surface 216 of the carrier 210 is greater than height h of the package module 230 in the same direction. In other words, the depth d of the via hole 262 is greater than the height h of the stacked chips. Similarly, the via holes 264 align with the bonding pads 237 on the second chip 236 so that each via hole 264 is directly linked to a contact 243.

Figure 5:
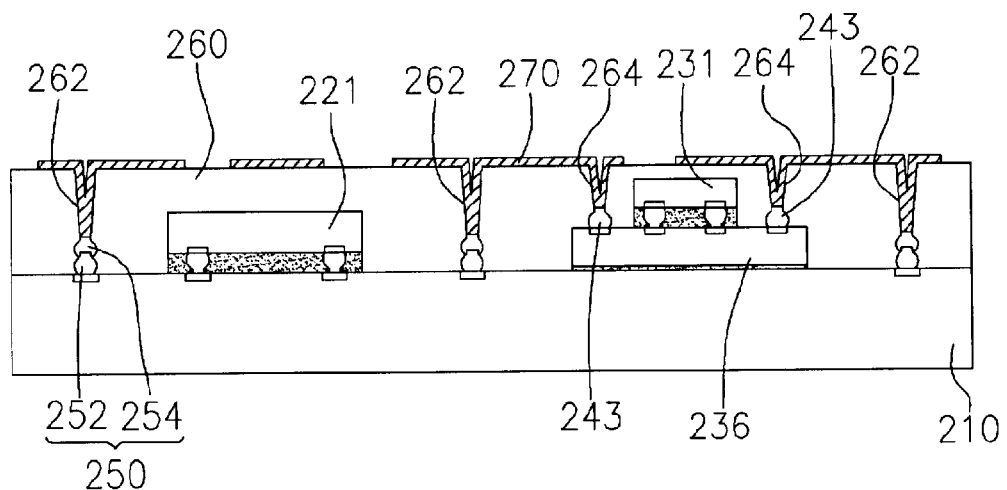

As shown in FIG. 5, a metallic layer 270 is formed over the insulation layer 260 by sputtering or electroplating. The metallic layer 270 also fills the via holes 262 and 264 to connect with the contacts 250 and 243. Thereafter, photolithographic and etching processes are carried out to pattern the metallic layer 270 so that the chips 221, 231, 236 and the carrier 210 are electrically interconnected through the contacts 243, 250 and the patterned metallic layer 270.

Figure 6:
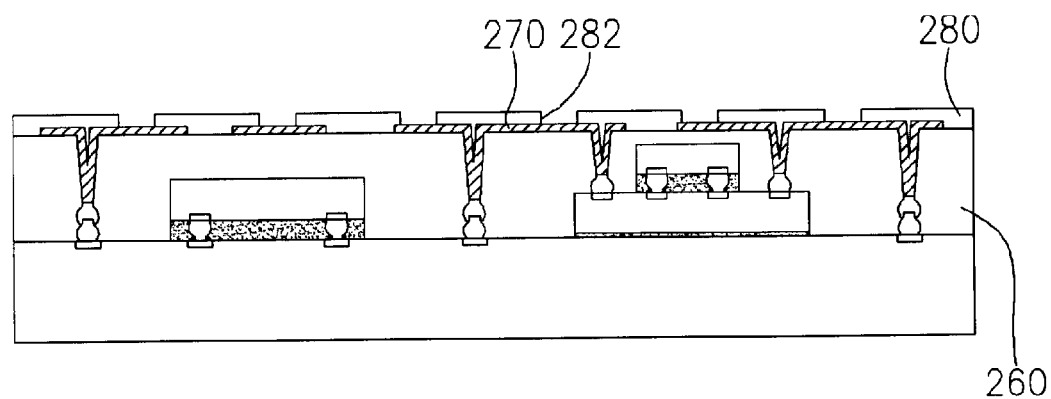

As shown in FIG. 6, an insulation layer 280 is formed over the insulation layer 260 and the metallic layer 270 by spin-coating or processing with a thermal press. Thereafter, photolithographic and etching processes are carried out to form a plurality of openings 282 that exposes a portion of the metallic layer 270.

Figure 7:
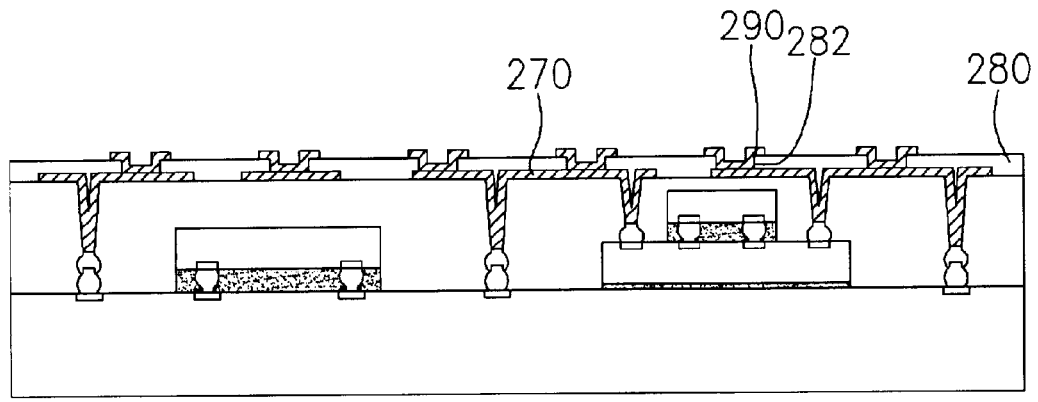
Figure 8:
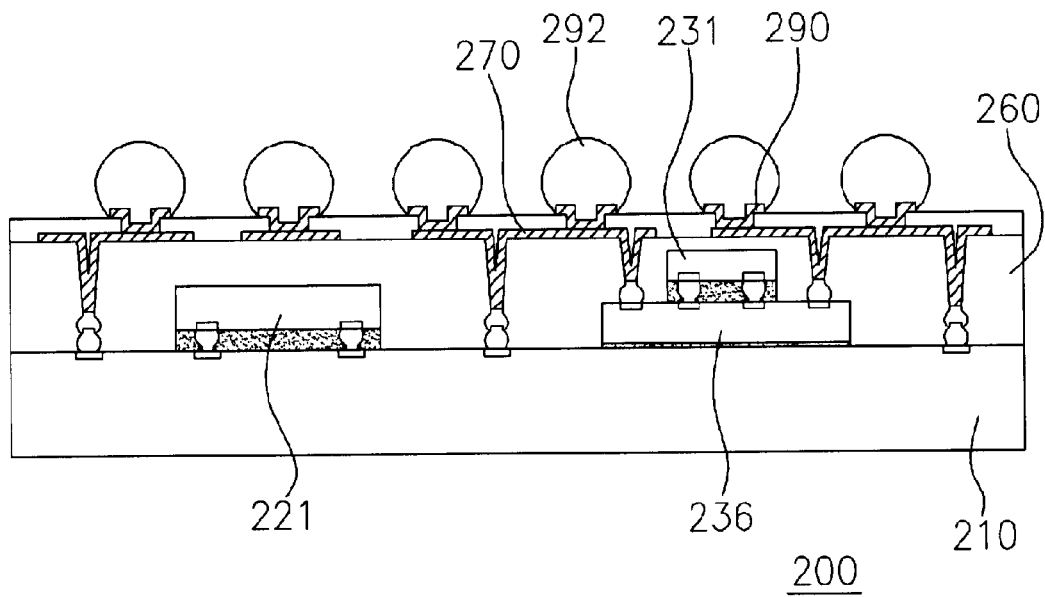

As shown in FIG. 7, a patterned metallic layer 290 is formed over the insulation layer 280 filling various openings 282 in the insulation layer 280 so that the metallic layer 290 is in contact with the metallic layer 270 underneath. As shown in FIG. 8, solder balls 292 are attached to the bonding pad layer 290 by performing a screen-printing or a ball placing operation. After the last operation, a complete multi-chip package 200 is formed and ready to be connected with an external circuit through the solder balls 292.

Figure 9:
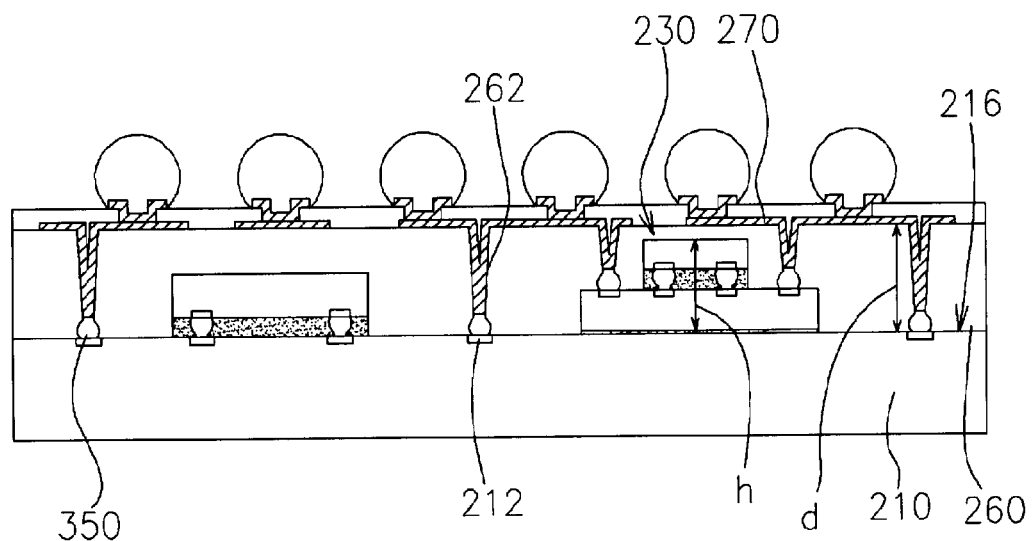
FIG. 9 is a schematic cross-sectional view of a multi-chip package structure according to a second preferred embodiment of this invention.
Figure 10:
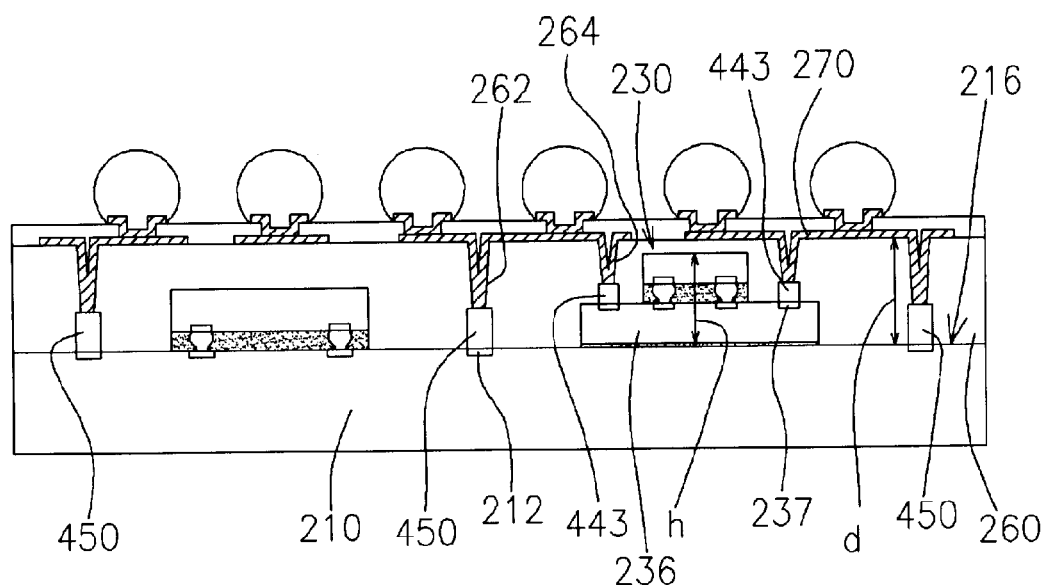
FIG. 10 is a schematic cross-sectional view of a multi-chip package structure according to a third preferred embodiment of this invention.
Figure 11:
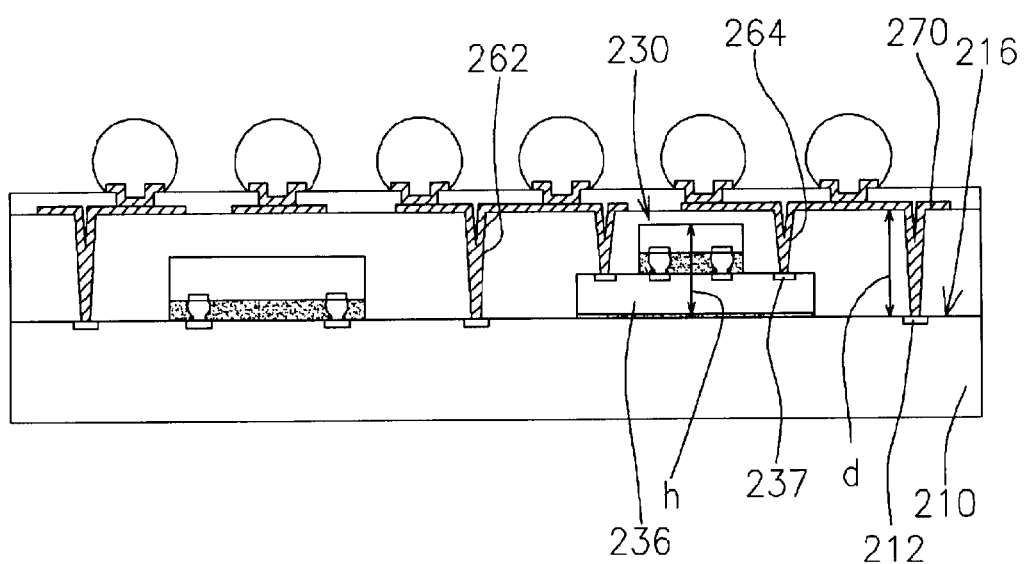
FIG. 11 is a schematic cross-sectional view of a multi-chip package structure according to a fourth preferred embodiment of this invention.

In this invention, the contacts 250 and 243 shown in FIGS. 2 to 8 are not the only possible configuration. According to the method of forming the via holes, the metal filling capability and the depth of the via holes, various types of contacts can be made. For example, each contact can be a single bump (as shown in FIG. 9) or a stack of bumps (as shown in FIG. 8). Moreover, the bumps can be solder bumps or stud bumps. Furthermore, each contact can be a conductive column (as shown in FIG. 10). Alternatively, the patterned metallic layer 270 may reach the bonding pads 212 and 237 directly, thereby eliminating the need to fabricate the contacts 250 and 243 altogether (as shown in FIG. 11).

According to the embodiment of this invention, one major aspect of the multi-chip package structure is that the depth of via holes is greater than the vertical height of the package module. Moreover, the number of stacked chips inside the package module is not limited to two. If more than two chips are incorporated inside the package module, the via holes must have a depth greater than the total height of the stacked chips.

In conclusion, major advantages of this invention at least includes:

1. Because the chips are electrically connected using a flip chip bonding technique, the length of electrical paths between different chips is shortened on average. Hence, signal transmission quality inside the multi-chip package is improved.

2. The insulation layer and the patterned metallic layer are formed over the carrier only after all package modules have been attached to the carrier. Therefore, only one patterned metallic layer serving as interconnect is required to form the multi-chip package. In other words, the multi-chip package can be fabricated with fewer steps so that the processing efficiency is improved.

3. Since the package modules can be electrically pre-tested before assembling to the carrier, overall yield of the multi-chip package will increase.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A multi-chip package structure, comprising:
   a carrier with a surface;
   at least a package module positioned on the surface of the carrier, wherein the package module has a plurality of chips, at least two of which are stacked;
   an insulation layer positioned on the surface of the carrier enclosing the package module, wherein the insulation layer has a plurality of first via holes linked to the surface of the carrier, and a depth of the first via hole in a direction perpendicular to the surface of the carrier is greater than a height of the package module in the same direction; and
   a patterned metallic layer positioned on the insulation layer and filling the first via holes, wherein the patterned metallic layer serves as interconnecting lines inside the multi-chip package.

2. The multi-chip package of claim 1, wherein the package further comprises a plurality of contacts attached to the surface of the carrier and enclosed within the first via holes so that the patterned metallic layer and the carrier are electrically connected through the contacts.

3. The multi-chip package of claim 1, wherein the stacked chips within the package module are joined together using a flip chip bonding technique.

4. The multi-chip package of claim 1, wherein the insulation layer has a plurality of second via holes linked to at least one of the chips of the package module, and the patterned metallic layer fills the second via holes.

5. The multi-chip package of claim 4, wherein the package further comprises a plurality of contacts attached to at least one of the chips and enclosed within the second via holes such that the patterned metallic layer and at least one of the chips are electrically connected through the contacts.

6. The multi-chip package of claim 1, wherein the carrier is a chip.

7. The multi-chip package of claim 1, wherein the carrier is an integrated circuit package substrate.

8. A process of fabricating a multi-chip package, comprising the steps of:
   providing at least a package module and a carrier, wherein the package module has a plurality of stacked chips;
   attaching the package module to a surface of the carrier;
   forming a first insulation layer on the surface of the carrier so that the package module is enclosed;
   forming a plurality of first via holes that passes through the first insulation layer and links to the carrier;
   forming a patterned metallic layer over the first insulation layer and filling the first via holes, wherein the patterned metallic layer serves as interconnecting lines inside the multi-chip package; and
   forming a second insulation layer over the metallic layer, wherein the second insulation layer has a plurality of openings that exposes a portion of the metallic layer.

9. The process of claim 8, wherein the process further comprises attaching a plurality of contacts on the surface of the carrier within the first via holes.

10. The process of claim 8, wherein the stacked chips within the package module are connected using a flip chip bonding technique.

11. The process of claim 8, wherein the process further comprises forming a plurality of second via holes in the first insulation layer and linked to at least one of the chips of the package module and the patterned metallic layer fills the second via holes.

12. The process of claim 11, wherein at least one of the chips of the package module has a plurality of contacts located within the second via holes, and the patterned metallic layer and the chip are electrically connected through the contacts.

13. The process of claim 8, wherein the carrier is a chip.

14. The process of claim 8, wherein the carrier is an integrated circuit package substrate.

15. The process of claim 8, wherein before attaching the package module to the surface of the carrier, the process further comprises electrically testing the package module.

16. A multi-chip package structure, comprising:
   a carrier with a surface;
   at least a package module positioned on the surface of the carrier, wherein the package module has a plurality of chips, at least two of which are stacked;
   a first insulation layer positioned on the surface of the carrier enclosing the package module, wherein the first insulation layer has a plurality of first via holes linked to the surface of the carrier and a second via holes linked to at least one of the chips in the package module, and a depth of the first via hole in a direction perpendicular to the surface of the carrier is greater than a height of the package module in the same direction;

a patterned metallic layer positioned on the first insulation layer and filling the first via holes and the second via holes, wherein the patterned metallic layer serves as interconnecting lines inside the multi-chip package;

a second insulation layer positioned over the metallic layer, wherein the second insulation layer has a plurality of openings that exposes a portion of the metallic layer; and a plurality of first contacts deposited on the metallic layer exposed by the openings of the second insulation layer.

17. The multi-chip package of claim 16, wherein the package further comprises a plurality of second contacts attached to the surface of the carrier and enclosed within the first via holes, and the patterned metallic layer and the carrier are electrically connected through the second contacts.

18. The multi-chip package of claim 16, wherein the stacked chips within the package module are joined together using a flip chip bonding technique.

19. The multi-chip package of claim 16, wherein the package further comprises a plurality of third contacts attached to at least one of the chips and enclosed within the second via holes, and the patterned metallic layer and at least one of the chips are electrically connected through the third contacts.

20. The multi-chip package of claim 16, wherein the carrier is a chip.

21. The multi-chip package of claim 16, wherein the carrier is an integrated circuit package substrate.

* * * * *